United States Patent
Wang

(10) Patent No.: US 8,617,916 B1
(45) Date of Patent: Dec. 31, 2013

(54) CHEMICAL BATH DEPOSITION METHOD FOR FABRICATION OF SEMICONDUCTOR FILMS

(71) Applicant: Jiaxiong Wang, Danville, CA (US)

(72) Inventor: Jiaxiong Wang, Danville, CA (US)

( * ) Notice: Subject to any disclaimer, the term of this patent is extended or adjusted under 35 U.S.C. 154(b) by 0 days.

(21) Appl. No.: 13/971,850

(22) Filed: Aug. 21, 2013

Related U.S. Application Data

(62) Division of application No. 13/172,826, filed on Jun. 30, 2011.

(51) Int. Cl.
*H01L 31/0296* (2006.01)
*H01L 31/0304* (2006.01)
*H01L 31/032* (2006.01)
*H01L 31/0272* (2006.01)
*H01L 31/0312* (2006.01)

(52) U.S. Cl.
USPC .......... 438/86; 438/85; 438/94; 257/E31.009; 257/E31.016; 257/E31.02; 257/E31.024; 257/E31.029; 257/E31.027

(58) Field of Classification Search
None
See application file for complete search history.

(56) References Cited

U.S. PATENT DOCUMENTS

| | | | | |
|---|---|---|---|---|
| 6,026,830 A * | 2/2000 | Huang | ............... | 134/66 |
| 6,857,795 B2 * | 2/2005 | Lu et al. | ............... | 396/575 |
| 8,361,240 B2 * | 1/2013 | Hashimoto | ............... | 134/26 |
| 2009/0180086 A1 * | 7/2009 | Ryu et al. | ............... | 355/30 |
| 2011/0256656 A1 * | 10/2011 | Wang | ............... | 438/62 |

* cited by examiner

*Primary Examiner* — Seahvosh Nikmanesh

(57) ABSTRACT

A chemical bath deposition method is presented to prepare different thin films on plane substrates. In particular, they are useful to deposit CdS or ZnS buffer layers in manufacture of thin film solar cells. This method and the deposition apparatus deposit thin films onto vertically travelling plane workpieces delivered by a conveyor belt. The thin films are deposited by continuously spraying the reaction solutions from their freshly mixed styles to gradually aged forms until the designed thickness is obtained. The substrates and the solutions are heated to a reaction temperature. During the deposition processes, the front surfaces of the substrates are totally covered with the sprayed solutions but the substrate backsides are remained dry. The reaction ambience inside the reactor can be isolated from the outside atmosphere. The method is designed to generate a minimum amount of waste solutions for chemical treatments.

5 Claims, 2 Drawing Sheets

CHEMICAL BATH DEPOSITION METHOD FOR FABRICATION OF SEMICONDUCTOR FILMS

CROSS REFERENCE TO RELATED APPLICATIONS

This invention claims the benefit of a divisional application of U.S. patent application Ser. No. 13/172,826 filed on Jun. 30, 2011 and published on Jan. 3, 2013 with a Publication No. US 2013/0005073 A1, which is incorporated herein by reference in its entirety.

FIELD OF THE INVENTION

The present invention relates to a chemical bath deposition (CBD) method that can be used to deposit semiconductor thin films onto plane substrates. It is particularly useful for deposition of cadmium sulfide (CdS) or zinc sulfide (ZnS) semiconductor films for fabrication of thin film solar cells.

BACKGROUND

Photovoltaic technology has been developed under a background of global warming and exhausting of fossil fuels. The substitutes of traditional energy sources include nuclear energy and renewable energy. Among them, the nuclear energy will also be exhausted in the future. Moreover, the potential radiation contamination arising from the nuclear energy may bring serious problems to our environment, especially after the recent accident in a nuclear power station of Japan. Therefore, our future may greatly rely on renewable energy. The photovoltaic devices, or solar cells, are playing a leading role in the renewable energy. This enormous future demand has dramatically pushed the development of photovoltaic technology. At present, the second generation photovoltaic devices, thin film solar cells, have appeared in the global market. They currently include three main types: amorphous silicon, CIGS and CdTe. In this thin film solar cell family, an amorphous silicon cell has a low conversion efficiency that may reach up to 13% for a triple junction design. Besides, it has a problem of power degradation with initial illumination, but its technology is relatively mature. By contrast, a CIGS solar cell possesses the highest conversion efficiency that is as high as 20%, higher than 17% efficiency of the CdTe ones. In the periodic table of the elements, the elements of a CIGS absorber are located in Group IB-IIIA-VIA and the ones of a CdTe absorber in Group IIB-VIA. These absorber materials all belong to multi-component p-type semiconductors. For such a semiconductor material, the distribution of different components and stoichiometry may determine the quality of the material.

Both of CIGS and CdTe solar cells contain a stack of absorber/buffer thin film layers to create an efficient photovoltaic heterojunction. A metal oxide window containing a highly resistive layer, which has a band gap to transmit the sunlight to the absorber/buffer interface, and a lowly resistive layer to minimize the resistive losses and provide electric contacts, is deposited onto the absorber/buffer surface. This kind of design significantly reduces the charge carrier recombination in the window layer and/or in the window/buffer interface because most of the charge carrier generation and separation are localized within the absorber layer. In general, CIGS solar cell is a typical case in Group IB-IIIA-VIA compound semiconductors comprising some of the Group IB (Cu, Ag, Au), Group IIIA (B, Al, Ga, In, Tl) and Group VIA (O, S, Se, Te, Po) elements of the periodic table. These elements are excellent absorber materials for thin film solar cells. In particular, compounds containing Cu, In, Ga, Se and S are generally referred to as CIGS(S), or $Cu(In,Ga)(S,Se)_2$ or $CuIn_{1-x}Ga_x(S_ySe_{1-y})_n$, where $0 \leq x \leq 1$, $0 \leq y \leq 1$ and n is approximately 2, and have already been applied in the solar cell structures that gave rise to conversion efficiencies approaching 20%. Here, $Cu(In,Ga)(S,Se)_2$ means the whole family of compounds with Ga/(Ga+In) molar ratio varying from 0 to 1, and Se/(Se+S) molar ratio varying from 0 to 1. It should be noted that the molar ratios of Ga/(Ga+In) and Cu/(Ga+In) are very important factors to determine the compositions and the conversion efficiencies of the CIGS solar cells. In general, a good CIGS solar cell requires a ratio of Cu/(Ga+In) between 0.75 and 0.95, and Ga/(Ga+In) between 0.3 and 0.6. In comparison with CIGS, the composition of a CdTe solar cell is much simple. In general, the content of Cd is close to 50% in the CdTe films. However, the Cd content may change after the deposition of a CdS layer and the subsequent annealing procedure. Close to the interface of the p-n-junction, for example, a $CdS_xTe_{1-x}$ layer is formed with x usually not exceeding 0.06. However, x has a range changing from 0 to 1, which results in a compound from CdTe (x=0) to CdS (x=1).

Both CIGS and CdTe films have to be annealed to form a uniform stoichiometric compound. A CIGS film is usually annealed at a temperature between 350 and 600° C. in a typical two-stage fabrication procedure. For a CdTe solar cell, a CdS film may firstly be annealed in a superstrate configuration and a CdS/CdTe bilayer may be annealed in a substrate configuration. After annealing, an n-type semiconductor buffer layer such as CdS, ZnS, or $In_2S_3$ should be deposited onto a CIGS semiconductor absorber. After then, transparent conductive oxide (TCO) materials, i.e., ZnO, $SnO_2$, and ITO (indium-tin-oxide), should be deposited to form the solar cells. For a CdTe solar cell, CdS may be deposited onto the surface of CdTe or TCO, depending on its substrate or superstrate configuration. However, a superstrate configuration may not be applicable on a flexible workpiece on the basis of current technology. Therefore, CdS should be deposited onto a CdTe surface to fabricate a CdTe thin film solar cell on a flexible substrate. The CdS thickness requirement is similar to a CIGS and a CdTe cell. They usually require a thin layer of CdS with about 100 nm or thinner.

There are some different technologies to deposit CdS, such as vacuum sputtering and evaporation, spray pyrolysis and chemical bath deposition. Among them, the chemical bath deposition (CBD) seems to produce the best result. In comparison with the vacuum methods, the CBD process is simple and requires cheap equipment. The disadvantage is that it produces lots of cadmium wastes and the post-treatment may be a heavy work.

A common CdS chemical deposition bath contains a cadmium salt and a thiourea solution in ammonia medium. The ammonia medium in the solution plays two roles. On one hand, it provides $OH^-$ ions to hydrolyze thiourea, which slowly releases $S^{2-}$ into the solution. On the other hand, it controls the amount of $Cd^{2+}$ cations in the bath through the generation of its tetra-ammonium complexes that decompose to slowly release $Cd^{2+}$ into the solution. The slowly created $Cd^{2+}$ and $S^{2-}$ ions synthesize the CdS, some of which deposits onto the substrate surfaces. The reaction mechanism may be shown below:

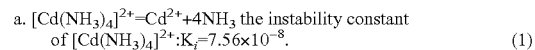

The stability product of CdS is: $K_{sp}=1.4\times10^{-29}$ in a strong alkaline solution.
There is a possible side reaction below:

$$Cd^{2+}+2OH^-\rightarrow Cd(OH)_2 \quad (4)$$

The solubility product constant of $Cd(OH)_2$ is: $K_{sp}=7.2\times10^{-15}$. However, $Cd(OH)_2$ will dissolve in the ammonia alkaline solution to become $[Cd(NH_3)_4]^{2+}$ complex cations and not affect the quality of the CdS product.

The CdS precipitation can take place either in the bulk solution to form colloids or at the immersed substrate surface to generate a layer of thin film. According to a main theory, the layer deposition may take three stages: 1). Induction with the ion adsorption and formation of nucleation centers; 2) layer growth with an "ion by ion" mechanism; and 3) layer growth with a "cluster by cluster" mechanism.

The key technology is that the solution must be freshly prepared to make the initial nucleation of CdS to take place directly on the surface of a substrate. Otherwise, the CdS deposition on the substrate surface may be powdery because the initial induction mainly takes place in the bulk solution and the deposition on the substrate may be directly from the "ion-by-ion" or even "cluster-by-cluster" stages. As reported in a U.S. Pat. No. 7,846,489 B2, which is incorporated herein by reference, the formation of CdS in a reaction solution follows two directions, i.e., a homogeneous particle formation in the solution and a heterogeneous film growth on a substrate surface. No matter which kind of mechanism is involved in the CdS formation in an alkaline solution, i.e., ion-by-ion, hydroxide cluster, or complex-decomposition mechanism, as discussed in literatures, a uniform growth of a CdS thin film on a substrate requires interaction between the substrate surface and un-reacted species firstly. A freshly prepared solution can meet this requirement very well. The reaction starting from a freshly prepared solution is not difficult to achieve in a laboratory work. The sample can be simply immersed into a freshly mixed solution at a certain reaction temperature. In fact, there are lots of literature reports relating to the CdS chemical bath deposition in laboratory works, including some patents such as U.S. Pat. No. 6,537,845 B1 describing a CdS chemical surface deposition onto glass substrates coated with CIGS films. Similar to a laboratory work, the same method can be applied to deposit CdS or ZnS thin film onto a plane substrate surface. For example, a glass plane substrate can be immersed into a tank loaded with a freshly mixed reaction solution to react for a period of time at a constant temperature to obtain a CdS thin film. During the reaction, the backside of the substrate can be sealed with a piece of protective membrane. It requires an excellent solution circulation to achieve a good uniformity of the deposited thin films. A lot of solution may be consumed and a waste treatment may be a very heavy work.

Although there are plenty of patents and publications related to CdS deposition via CBD methods, the apparatus or equipments for industrially manufacturing CdS or ZnS buffer layers in solar cells with a CBD process are seldom reported. Recently, some CBD apparatus and methods were described in U.S. Pat. No. 7,541,067 B2, US. Pat. Appl. Pub. Nos. 2011/0039366 A1, 2009/0255461 A1 and 2009/0246908 A1, which are incorporated herein by references. In these patent and applications, the CdS deposition apparatus were designed for roll-to-roll manufacture processes in fabrications of thin film CIGS solar cells. In these apparatuses, the freshly mixed solutions were delivered onto the surfaces of travelling flexible substrates and remained there during the periods of deposition reactions to grow up the CdS thin films.

The apparatuses presented in the patents described above require some special designs to remain the solutions on the surfaces of the moving flexible substrates in a roll-to-roll process. For example, the substrates might need to be bent using some magnetic or mechanical forces to hold the solutions on the tops. These applied forces may affect smooth movement of the flexible substrates. It might be difficult to remain the surfaces flat, especially for a wide web. It might always be a great challenge to remain backside of the substrates drying. These apparatus and methods cannot be applied in a plane substrate since its edges cannot be bent to maintain the solution on the front surface. I have recently submitted a patent application numbered Ser. No. 13/154,481 to provide a spray method and apparatus to deposit semiconductor films onto a vertically travelling continuous flexible substrate in a roll-to-roll process. The present invention is modified from the submitted one to deposit semiconductor films onto a plane substrate with a continuous transportation manner. The method and apparatus are also simple and inexpensive without generating significant amount of waste solutions.

SUMMARY OF THE INVENTION

The present invention provides a chemical bath deposition method to fabricate semiconductor thin films in preparation of solar cells. It possesses a unique design to vertically transport a series of plane substrates side by side continuously through the whole apparatus. The deposition solution is continuously sprayed onto the substrate surfaces through a whole process from a freshly mixed to an aged stage. During the whole process, the backsides of all the substrates remain dry. The structure of this equipment is very simple and inexpensive for fabrication. In addition, the preparation of semiconductor thin films with this apparatus is economical. It also saves volumes of the waste solution to greatly reduce expenses of the waste treatment.

The present invention can be used for preparing thin film materials onto the surfaces of plane substrates via a CBD method. It is particularly useful to fabricate CdS or ZnS films in preparation of Group IB-IIIA-VIA and Group IIB-VIA thin film solar cells. In comparison with previous inventions, the presently invented apparatus should provide a more convenient and economical way in preparation of thin films through a CBD process.

DETAILED DESCRIPTION OF THE INVENTION

The present invention provides a method for CBD deposition of CdS or ZnS thin films to fabricate Group IB-IIIA-VIA or Group IIB-VIA thin film solar cells on plane substrates. The present invention delivers the plane substrates side by side in a vertical position continuously through the whole CBD reactor. The materials of these plane substrates may include glass, plastics and ceramics. This process starts from cleaning the substrates, spraying a freshly mixed solution to the substrate surfaces, continuously spraying the aged solution to the substrates, washing away the reaction solution from the substrate surfaces while a desired thickness of the film is obtained, rinsing the freshly deposited thin films, and eventually to drying the films at the end. The length of this apparatus depends on the required thickness of thin films. The whole CBD reactor can be assembled with some modular segments. There are several advantages for this CBD reactor. Firstly, the apparatus is simply designed to result in an inexpensive fabrication. One does not have to worry how to hold a reaction solution on the substrate surface with the development of a thin film, which is requires a complicated mechanical design and significantly increases the cost to fabricate the reactor, especially for a wide substrate. Secondly, the present invention makes the plane substrates continuously delivered side by side through the CBD reactor by a conveyor belt, which is advantage to a large scale of industrial manufacture. Thirdly, the present invention can remain the backside of a substrate dry and clean, which may greatly reduce amount of the waste solutions for chemical treatments and make the deposition easier. Finally, the present invention separates the waste compartment from the rinsing sections. This also significantly reduces the waste amount and amount of the rinsing water because it can be reused in the waste compartment.

Figure 1:
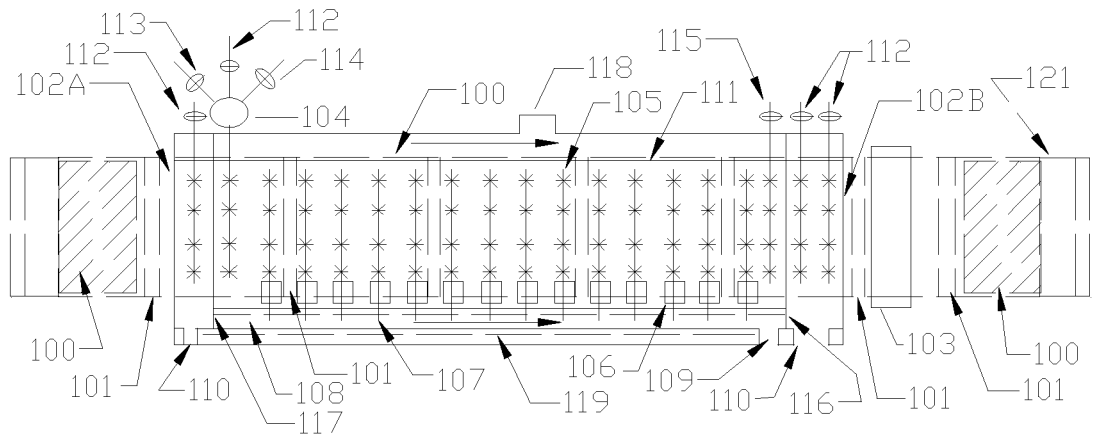
FIG. 1 shows a back view of an apparatus for a CBD deposition on plane substrates transported continuously by a stainless steel conveyor belt.
Figure 2:
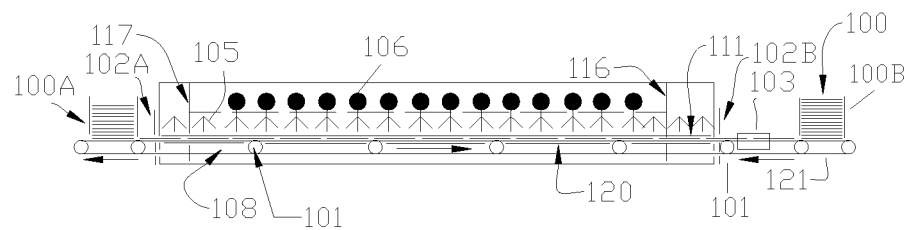
FIG. 2 shows a top view of an apparatus for a CBD deposition on plane substrates transported continuously by a stainless steel conveyor belt.

In an embodiment as shown in FIG. 1, a back view diagram for a presently invented apparatus, the plane substrate 100 is loaded onto the stainless steel conveyor belt 121 that continuously travels clockwise along the arrow direction. This conveyor belt brings the substrate 100 vertically through the entire reactor and releases it at the end of the apparatus. The conveyor belt then travels back at a constant speed. The substrate delivery can be more clearly illustrated in FIG. 2, a top view of the apparatus. The plane substrates are loaded in a rack 100A. They can be pushed toward the conveyor belt one by one and installed to the belt in one or two seconds. During this period, the belt can be temporarily stopped and continuously travels forward after loading this substrate. Then the belt will wait for next piece of substrate. In this way, the conveyor belt brings the substrates side by side vertically travelling into the reaction chamber of the apparatus through a narrow slit on the left side. After completion of the reaction, the substrates move out of another narrow slit on the right wall side by side. The substrates coated with the thin films are then delivered through the heater 103 and released to the unloading rack 100B when the belt temporarily stops, as shown in FIG. 1 and FIG. 2. There are a series of rollers 101, illustrated as circles in FIG. 2 and dashed narrow rectangles in FIG. 1, to control the conveyor belt movement.

In another aspect of the embodiment, the length of this CBD reactor is adjustable by adding or reducing numbers of modular segments. Every modular segment has a structure with surrounding a front wall that faces the substrate surface to be deposited, a back wall facing the substrate backside, a top roof and a bottom floor. At least two or more modular segments are connected together to form an isolated chamber of the said CBD reactor. The beginning and the ending segments contain a sidewall where a narrow slit is vertically cut to allow the substrate to enter or leave the chamber. The chamber can be separated with the board 117 and 116 into three sections, i.e., a pre-cleaning section close to the unwinding unit, the reaction chamber (main section), and a rinsing section close to the winding unit at the end, as shown more clearly in FIG. 2. Materials used to fabricate the modular segments must be chemical resistant, such as plastics, polymers, and ceramics. They are also required to resist heat up to 90° C. Especially for the bottom piece, some heating elements have to be installed underneath the solution groove 108. It should be able to resist a higher temperature. If the front and/or the back walls are made from non-transparent materials, some inorganic or organic glass windows shall be opened for an inspection purpose. The internal surfaces of these inspection windows should be treated as hydrophobicity to avoid water condensing. Heights of the front wall, back wall and sidewalls may be between 0.3 and 2.5 meters, depending on the width of a substrate. The width of the reaction chamber ranges from 0.3 to 1.5 meters. The reactor is adapted to be used in a in a continuous manner to deliver the plane substrates side by side to carry out reactions at an elevated temperature inside the isolated reaction chamber.

In a various aspect of the embodiment, the said reaction chamber contains one or more sets of pump and spray pipe combinations. Every such a combination contains one solution pump 106, one or more spray pipes 107, and at least one or more spray nozzles 105 opened on the pipes. The spray pipes possess closed ends on the tops with diameters from 10 to 80 millimeters. Materials of the pipes and nozzles must be chemical resistant such as plastics, polymers and ceramics. They can also resist heat up to 90° C. Solution chambers of the pumps shall be chemical resistant as well. The metal bodies of the pumps should be protected from the corrosive atmosphere. On the bottom floor, there is a groove 108 crossover the reaction chamber to collect gradually aged solution that flows synchronously along the same direction as the substrate moves. The pumps continuously pump the gradually aged solution out of the groove and spray it onto the substrate surface. The sprayed solution will flow downward to the floor into the groove. There are one or more pieces of heating elements 119 underneath the groove 108 to heat the solution up to an elevated temperature.

When the substrates are delivered side by side into the reactor, it firstly passes a narrow slit inlet on the left wall into the apparatus. Outside the narrow slits, there are two or more columns of air knives 102A, arranged along the front surface and the backside of the moving substrates, to gently blow preheated air into the chamber through the slit to prevent the atmosphere inside the chamber from leaking out. Similarly, two or more columns of air knives 102B are arranged on the other side out of the chamber, as shown in FIG. 1 and FIG. 2. When the conveyor belt travels back after unloading the substrates, it has to go through another pair of narrow slits to enter the internal chamber of the reactor. The air knives 102A and 102B, which are more clearly illustrated in FIG. 2, also blow the air into the chamber. After the substrates enter the chamber, they are firstly washed by preheated DI water introduced through the valve 112 and sprayed out of a column of spray nozzles 105. The DI water will cover the whole substrate surfaces from the top to the bottom to clean the surfaces and wet them before CdS deposition. If the DI water cannot cover the substrate surfaces very well due to insufficient pressure, a booster pump may be used before the water enters the pre-clean chamber. The preheated DI water also helps to heat the substrates to a reaction temperature. This DI water washing section has been separated from the main reaction chamber with a board 117. The used water flows through a solution outlet 110A to exhaust without any special treatment.

Figure 3:
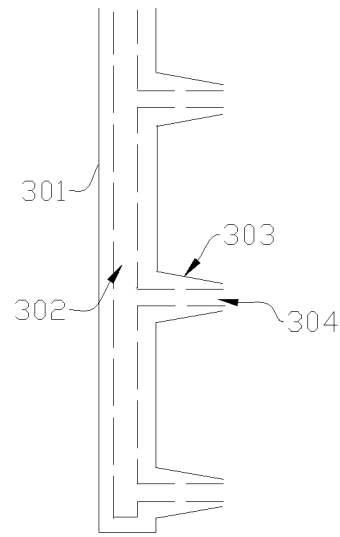
FIG. 3 illustrates a schematic diagram of air-solution spray nozzles.

The substrates then move into the CBD reaction chamber. As illustrated in FIG. 1, there is a solution mixing vessel 104 on top of the reactor. It can be installed inside the reaction chamber as well. In this mixing vessel, three solution inlets introduce mother liquids into the mixing vessel through the valves 112B, 113 and 114. Valve 112B delivers the preheated DI water, Valve 113 carries one preheated reaction mother liquid such as $Cd^2$ cation ammonia solution, and Valve 114 delivers another preheated reaction mother liquid such as thiourea solution. All of these three solutions are sprayed into the mixing vessel 104. This mixing vessel possesses a oval or pear shape. The sprayed solutions swirl down around the round internal wall and pass a small opening on the bottom of the vessel. During this process, the solutions have been well mixed in just a couple of seconds. The bottom opening of the vessel connected to a pipe 107 with some spray nozzles 105 to spray the mixed solution onto the substrate surface from the top to the bottom. In order to increase the pressure to spray the solution, an air tube can be introduced to the nozzles as demonstrated on FIG. 3. In this device, the solution pipe 302 is incorporated inside an air tube 301. The solution flows from the top to the bottom, runs out of the nozzles 304 and is sprayed by the compressed air nozzles 303. This device carries preheated compressed air to help the solution spray, similar to a spray pyrolysis process. The preheated air helps to remain a constant temperature inside the reaction chamber.

When the freshly mixed solution is sprayed onto the substrate surfaces, $[Cd(NH_3)_4]^{2+}$ and $(NH_2)_2CS$ will start to adsorb and nucleate on the surfaces at an induction stage. The used solution flows down into a groove 108, which width is clearly illustrated in FIG. 2, under the substrate and slowly flows to the direction as the substrate move. Then this used solution is pumped up by a pump 106, and then sprayed onto the substrate surfaces again through the pipe 107 and the spray nozzles 105. In this case, the top end of the spray pipe is blocked and the solution is sprayed out with pressure out of the nozzles 105 from the top to the bottom. The reacted solution flows back to the groove 108 again and is pumped up again with a next pump, as illustrated in FIG. 1 and FIG. 2. With the substrate movements to the right direction, their surfaces are covered with the solutions pumped and sprayed from a series of the pump-spray pipe combinations. The substrate surfaces are continuously reacted from the freshly mixed solution to gradually aged solution until end of the CBD process. The deposited layers will go through the induction and film growth processes to achieve high quality thin films. During the whole CBD process, density of the pumps and the spray pipes should be arranged in a way of covering and wetting the full substrate surfaces. The length of the reaction chamber can be determined by the substrate delivery speed and the designed reaction time. If a substrate delivery speed is 1 meter per minute and the reaction time is 10 minutes, for instance, a 10 meter long reaction chamber is necessary.

In FIG. 1, the dashed line 119 represents a series of heating elements underneath the solution groove 108. As a certain aspect of the embodiment, these heating elements can be fully program-controlled to heat the solution to a constant temperature. In front of the top edges of the substrates, there is a board 111 crossover the whole chamber. It is designed to block the solution from spraying to the backside. The conveyor belt should be designed in this way—the left and right edges of the substrates can be tightly sealed to avoid the solution spraying onto the backsides of the substrates. Moreover, the spaces between two substrates are closed to avoid the solution penetrated to the backside of the belt. In back of the bottom edge of the belt, there is a row of air knives 120, as shown in FIG. 2, crossover the whole chamber, as illustrated in FIG. 2. They gently blow the preheated air to the back bottom edges of the substrates to prevent the solution from wetting onto the back edges of the substrates. These arrangements may remain the entire backside of the conveyor belt and all of the substrate backs dry during the whole CBD process.

At the end of the reaction chamber as separated with a board 116, the substrate surfaces are washed with the used DI water through a valve 115. The DI water here has been used at the next rinsing stage but preheated before it is used in the reaction chamber. Also, the preheated compressed air may be used here to help spraying if necessary. The aged solution and this washing solution are combined here and flow out of the waste outlet 109 on the equipment bottom floor. This waste solution contains cadmium, sulfur, ammonium and other chemicals. It needs to be seriously treated.

When the substrates go through the slit on a separation board 116 into the rinsing chamber, perhaps 99% of the residue of the reaction solution has been washed away in the previous washing stage. In this section, the substrate surfaces are further rinsed twice with clean DI water delivered through the valves 112 to make the deposited film totally clean. The rinsed water is collected through the water outlet 110B on the equipment bottom floor, and a part of it is reused to wash the substrates in the previous reaction chamber. The cleaned substrates are now travelling out of the chamber isolated from outside atmosphere. When they go through the slit in the end wall, they are pre-dried by the air knives 102B and further dried through a heating device 103 before they are released to the unloading rack 100B and taken away.

Within the reaction chamber, the atmosphere is controlled at a constant temperature with the heating elements on the bottom and the preheated air, DI water and the solutions. The waste gas containing ammonium is exhausted through the top outlet 118 to an evacuation system. Due to the corrosive property of the atmosphere inside the reaction chamber, the materials used to fabricate this apparatus must be chemically resistant. For example, stainless steel for any metal parts and ceramic bearings used for transmission. The grease is not recommended to be used inside the reaction chamber. The main body may be prepared from some glass or chemically resistant polymers such as high density polyethylene (PTFE), polypropylene (PP), and fluoroplastics (PTFE). Most chemically resistant polymer or plastic materials cannot support a very high temperature. If a reaction temperature is higher than 80° C., therefore, the PTFE may be a good choice.

Example

A CdS Film Deposition for Fabrication of a CIGS Solar Cell

Figure 4:
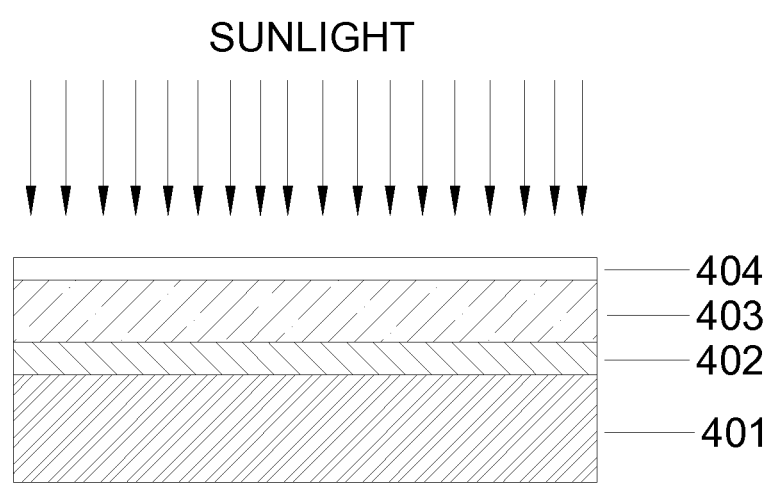
FIG. 4 is a schematic diagram illustrating a CdS buffer layer deposited onto a CIGS solar cell absorber layer by a chemical bath deposition process.

The present invention can be demonstrated with an example to deposit a CdS thin film on the surface of a CIGS absorber layer, as shown in FIG. 4. This figure is a schematic diagram illustrating the deposition of a CdS buffer 404 onto a CIGS absorber layer 403 that is coated on a piece of glass substrate 401 isolated with a Mo layer 402 as a back contact electrode. As an example, some 1.2×0.8 meter glass substrates coated with CIGS absorber layers may be used and delivered at a speed of 1 meter per minute. The CBD reaction chamber between the separation boards 117 and 116 is designed to be 12 meters long to meet a 12 minutes of reaction time. The conveyor belt may be fabricated with stainless steel and possesses frames to hold the substrates. The belt takes 2 seconds to load a substrate. If a CIGS surface is assumed to be covered with a 3 mm thick solution during the deposition, 3.6 liters of solution shall be consumed in one minute. If the substrates are arranged with a height of 1.2 meter and a width of 0.8 meter and only 1 cm space between 2 substrates, it takes about 53 seconds between two substrate delivery in order to coat a 100 nm thick CdS film onto a substrate with 0.96 $m^2$. About 70 substrates can be coated in one hour with a consumption of the solution volume of about 0.22 m³. To increase the efficiency of the spray, one may want to increase the solution consumption to 6 liters per minute. Twelve spray nozzles 105 can be arranged from the top to the bottom. In this way, every spray nozzle covers the area of 10×10 cm² with 10 ml of solution spraying out every second. However, a solution consumption of 6 liters per minute may not be necessary. One can control the top spray nozzles with more solution volume and gradually reduce the sprayed amount from the top to the bottom because the solution flows down from the top to the bottom. Sizes and distribution of the sprayed solution droplets can be well controlled by controlling the air pressure within the nozzles for the freshly mixed solution and the pump pressures for the aged one. To be careful, one can select a spray rate of 4.5 liters per minute. The total volume of the reaction solution used to complete these 70 pieces of substrates in one hour should be about 0.27 m³. Two starting mother liquids should be prepared in two mixing tanks and then stored in two storage tanks with heating capabilities. One starting mother liquid is cadmium cation in concentrated ammonium hydroxide. The other one is a concentrated thiourea solution. A small tank such as 500 liters should be enough to mix and store the thiourea solution, but a tank volume larger than 1 m³ is necessary to mix and store the cadmium ammonium solution. In addition, a large DI water container with a volume of 3 m³ or more is required for the solution mixing. Two starting mother liquids and DI water are preheated and delivered at a quantitative ratio and a total volume of more than 4.5 liters per minute to be mixed inside the vessel 104 and sprayed onto the travelling substrates. Turn on all of the air knives at a constant air temperature between 65 and 75° C. Meanwhile, the heating elements 119 underneath the solution groove 108 are adjusted to a temperature higher than 75° C. to remain a constant solution temperature between 65 and 75° C. as required. Turn on all the spray pumps 106 to remain the reaction under control. The pumps and the heating elements are all automatically controlled through an operation software.

At the end of the reaction chamber, the substrates are washed with the preheated DI water that has been used to rinse the substrate surface in next stage. In order to remove the reaction residues from the CdS surface as more as possible, one may use 6 liters of DI water per minute. As a result, more than 10 liters of the waste solution per minute are poured into the waste outlet 109. In one hour, about 0.6 m³ of the waste solution will be generated. It suggests that a waste treatment capability of 0.7 m³ per hour may be necessary. By optimizing the washing process, one could reduce consumption of the washing solution to 5 liters per minute to minimize the waste treatment capability down to 0.5-0.6 m³ per hour. The substrate surfaces can then be further washed, dried and unloaded one by one. After completion of the production, one can use some diluted hydrochloric acid to clean the belt, the pumps and the spray pipes including the nozzles.

As the art described and exampled above, the present invention can be used to fabricate many different deposition materials if their preparations follow a CBD process. These deposition materials include but are not limit to: $Ag_2S$, $Ag_2O$, $Al_2O_3$, $As_2S_3$, $Bi_2S_3$, CdS, CdO, CdTe, CdZnS, CoS, $CuBiS_2$, $CuInS_2$, $Cu_2S$, CuS, CuSe, $Cu_2O$, CuO, FeO(OH), $Fe_2O_3$, $Fe_3O_4$, $Fe_2S_3$, $Fe_3S_4$, $Ga_2S_3$, HgS, $In_2O_3$, $In_2S_3$, $In_2Se_3$, $La_2O_3$, MgO, MnS, $MnO_2$, $MoS_2$, $NbO_2$, $NbS_2$, NiS, NiO, PbHgS, PbS, $PbO_2$, $ReO_3$, $RhO_2$, $RuO_2$, $Ru_2O_3$, $Sb_2S_3$, $SiO_2$, SnS, $SnS_2$, $SnO_2$, $TiO_2$, TlS, $Tl_2O_3$, $VO_2$, $WO_3$, ZnO, ZnS, $ZrO_2$, or combinations thereof.

In particular, this apparatus and process are very useful to deposit CdS, ZnS, $In_2S_3$ or CdZnS window layers in manufacture of Group IB-IIIA-VIA and Group IIB-VIA solar cells onto the plane substrates with different widths. The equipment is easy to make, the process is easy to control, and the waste solutions are less.

What is claimed is:

1. A chemical bath deposition (CBD) method for forming thin films on plane substrate surfaces, comprising:

processing vertically travelling plane substrates with their surfaces to be deposited wetted by a number of spray nozzles but the backsides remaining dry with air knives during the whole process, and with their surfaces to be deposited firstly washed with clean deionized water, then sprayed by a freshly mixed reaction solution, followed by a number of spray steps with a series of gradually aged reaction solutions, and finally washed, rinsed and dried;

maintaining the workpiece and the solutions at a constant enhanced reaction temperature by preheating all of the reactant solutions, deionized water and the air before they enter a well isolated reactor, and heating the gradually aged solution underneath the solution groove;

mixing the CBD solution in seconds from two or more preheated reactant solutions plus preheated deionized water inside a rounded or pear shaped device with a small outlet;

spraying the clean deionized water, freshly mixed and gradually aged reaction solutions with a series of combinations composed of solution pipes, spray nozzles, and pumps or compressed air nozzles;

spraying the freshly mixed reaction solution continuously onto the surfaces of a series of vertically travelling plane substrates, collecting the sprayed and gradually aged solution and spraying it back onto the travelling substrate surfaces continuously until the predicted film thickness is obtained;

washing the residue solution away from the deposited surface using minimum rinsed water to reduce volumes of the waste to be treated and the deionized rinsing water.

2. The method of claim 1, wherein the deposited film materials include: $Ag_2S$, $Ag_2O$, $Al_2O_3$, $As_2S_3$, $Bi_2S_3$, CdS, CdO, CdTe, CdZnS, CoS, $CuBiS_2$, $CuInS_2$, $Cu_2S$, CuS, CuSe, $Cu_2O$, CuO, FeO(OH), $Fe_2O_3$, $Fe_3O_4$, $Fe_2S_3$, $Fe_3S_4$, $Ga_2S_3$, HgS, $In_2O_3$, $In_2S_3$, $In_2Se_3$, $La_2O_3$, MgO, MnS, $MnO_2$, $MoS_2$, $NbO_2$, $NbS_2$, NiS, NiO, PbHgS, PbS, $PbO_2$, $ReO_3$, $RhO_2$, $RuO_2$, $Ru_2O_3$, $Sb_2S_3$, $SiO_2$, SnS, $SnS_2$, $SnO_2$, $TiO_2$, TlS, $Tl_2O_3$, $VO_2$, $WO_3$, ZnO, ZnS, $ZrO_2$, or combinations thereof.

3. The method of claim 1, wherein the plane substrates coated with solar cell absorber layers are loaded and a buffer layer material including CdS, $In_2S_3$ and ZnS is deposited from this CBD reactor to fabricate thin film solar cells, especially $Cu(In_{1-x}Ga_x)Se_2$ (CIGS) and CdTe cells.

4. The method of claim 1, wherein the plane substrates are made from glass, silicon crystalline, ceramic, polymer, plastic or metallic materials.

5. The method of claim 1, wherein the width and the length of said plain substrates rang from 0.1 to 2.0 meters and 0.1 to 2.5 meters, respectively.

* * * * *